US012749516B2

(12) United States Patent
Zhang et al.

(10) Patent No.: US 12,749,516 B2
(45) Date of Patent: Sep. 29, 2026

(54) METHOD AND DEVICE FOR ADJUSTING PHASE OF BIDIRECTIONAL DATA STROBE (DQS) SIGNAL

(71) Applicant: SHENZHEN PANGO MICROSYSTEMS CO.,LTD, Shenzhen (CN)

(72) Inventors: Jin Zhang, Shenzhen (CN); Wei Ding, Shenzhen (CN); Rushang Huang, Shenzhen (CN)

(73) Assignee: SHENZHEN PANGO MICROSYSTEMS CO., LTD, Shenzhen (CN)

( * ) Notice: Subject to any disclaimer, the term of this patent is extended or adjusted under 35 U.S.C. 154(b) by 123 days.

(21) Appl. No.: 18/757,528

(22) Filed: Jun. 28, 2024

(65) Prior Publication Data

US 2024/0355373 A1 Oct. 24, 2024

Related U.S. Application Data

(63) Continuation of application No. PCT/CN2022/091308, filed on May 6, 2022.

(30) Foreign Application Priority Data

Dec. 29, 2021 (CN) ........................ 202111644785.2

(51) Int. Cl.

*G11C 7/22* (2006.01)
*G11C 7/04* (2006.01)
*G11C 11/4076* (2006.01)

(52) U.S. Cl.

CPC .................. *G11C 7/22* (2013.01); *G11C 7/04* (2013.01); *G11C 11/4076* (2013.01)

(58) Field of Classification Search

CPC ..... G11C 7/222; G11C 29/022; G11C 29/023; G11C 29/028; G11C 7/04; G11C 11/4076; G11C 2207/2254; G11C 7/1078; G11C 7/1093; G11C 7/22; G11C 7/1072; G11C 16/10; G11C 16/0483; G11C 11/5628; G11C 16/26; G11C 16/16; G11C 16/14; G11C 16/3459; G11C 11/5642; G11C 16/3404; G11C 16/102; G11C 16/12; G11C 16/349; G11C 2211/5641; G11C 16/3418; G11C 16/3427; G11C 11/5635;

(Continued)

(56) References Cited

U.S. PATENT DOCUMENTS 9,536,589 B2 * 1/2017 Zerbe ................. G06F 13/4243

* cited by examiner

*Primary Examiner* — Amir Zarabian

(57) ABSTRACT

The present application discloses a method for adjusting phase of a DQS signal, which is applied to the field of field programmable logic gate arrays and is used to solve the temperature drift problem of the DQS signal in DDR. The method provided by the present application includes: receiving a phase adjustment instruction, and adjusting phase of the DQS signal according to a preset first adjustment rule; receiving a signal sampling instruction to sample the DQS signal, and returning a sampling result of the DQS signal; determining whether the sampling result is correct, and storing a determination result; cycling steps of receiving the phase adjustment instruction to storing the determination result until a number of cycles reaches a preset number of times; according to the determination result corresponding to the number of cycles, adjusting the phase of the DQS signal according to a preset second adjustment rule.

14 Claims, 5 Drawing Sheets

(58) Field of Classification Search
CPC ........ G11C 16/3454; G11C 2029/0411; G11C 16/00; G11C 16/08; G11C 16/34; G11C 16/0416; G11C 16/3431; G11C 11/56; G11C 16/0491; G11C 16/105; G11C 2211/5621; G11C 13/0069; G11C 16/24; G11C 11/5671; G11C 16/30; G11C 16/32; G11C 2029/0409; G11C 2216/14; G11C 29/021; G11C 11/5685; G11C 13/0007; G11C 13/0064; G11C 13/0097; G11C 16/107; G11C 16/3413; G11C 2013/0073; G11C 2213/31; G11C 2213/79; G11C 2216/16; G11C 2216/18; G11C 16/0475; G11C 2211/5644; G11C 16/04; G11C 16/06; G11C 2029/5004; G11C 2211/5646; G11C 29/42; G11C 29/50004; G11C 16/3409; G11C 16/3445; G11C 2211/5642; G11C 2216/20; G11C 29/52
See application file for complete search history.

Second adjustment rule table

| determination result of a preset number of cycles | **DQS Phase Adjustment** |
|---|---|
| the number of errors in adjusting to the left is less than a set number and the number of errors in adjusting to the right is greater than a set number | the phase of the DQS signal is adjusted to the left by a second preset angle |
| the number of errors in adjusting to the left is greater than a set number and the number of errors in adjusting to the right is less than a set number | the phase of the bidirectional data strobe DQS signal is adjusted to the right by a second preset angle |
| **Other result** | **the phase of DQS is not adjusted** |

FIG. 3

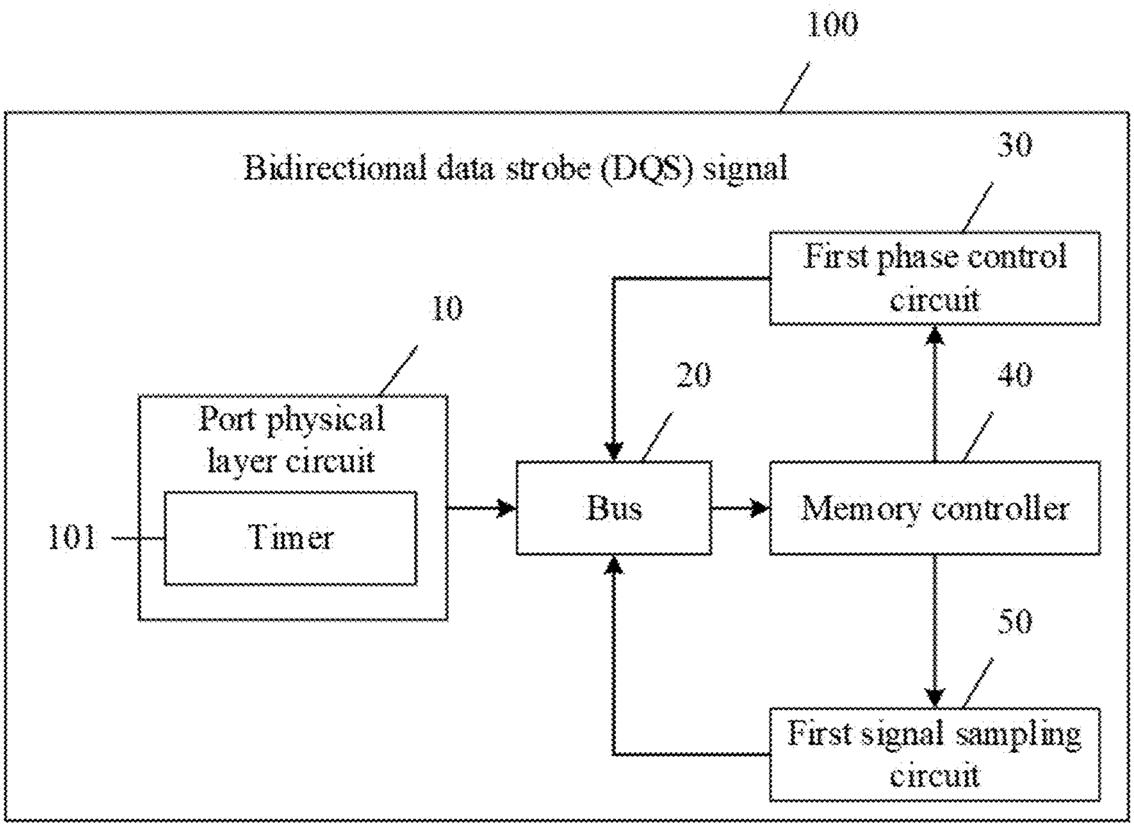

FIG. 4

METHOD AND DEVICE FOR ADJUSTING PHASE OF BIDIRECTIONAL DATA STROBE (DQS) SIGNAL

CROSS-REFERENCE TO RELATED APPLICATIONS

This application is a Bypass Continuation Application of PCT International Application No. PCT/CN2022/091308 filed on May 6, 2022, which claims priority to Chinese Patent Application No. 202111644785.2, filed on Dec. 29, 2022 and entitled "METHOD AND DEVICE FOR ADJUSTING PHASE OF BIDIRECTIONAL DATA STROBE (DQS) SIGNAL", the entire contents of which are incorporated herein by reference.

FIELD OF THE DISCLOSURE

The present application relates to the field of field programmable gate array technology, specifically to a method and device for adjusting phase of a bidirectional data strobe (DQS) signal.

BACKGROUND

In order to solve problems of bidirectional data strobe (DQS) temperature drift in double data rate SDRAM (DDR) of field programmable gate array (FPGA), one traditional method is to use a temperature drift monitoring circuit in a port physical layer (PHY) circuit to monitor a DQS temperature drift phenomenon in the DDR, and use a high-speed clock in the PHY circuit to perform 4× rate oversampling on the DQS signal, and adjust parameters of the DQS signal according to oversampling results. However, the inventor found that since performance of a high-speed sampling circuit in the PHY circuit is required to reach 4 times the rate of the DQS signal, the above requirement often becomes a bottleneck in chip design and also results in the temperature drift monitoring circuit not being able to work reliably, and thus the DQS temperature drift problem in DDR of FPGA cannot be truly solved.

SUMMARY

One embodiment of the present application provides a method and device for adjusting phase of a bidirectional data strobe DQS signal, which can solve the problem of DQS temperature drift in a double rate synchronous dynamic random access memory.

A method for adjusting phase of a bidirectional data strobe (DQS) signal, includes:

- receiving a phase adjustment instruction, and adjusting phase of the DQS signal according to a preset first adjustment rule;
- receiving a signal sampling instruction to sample the DQS signal, and returning a sampling result of the DQS signal;
- determining whether the sampling result is correct, and storing a determination result;
- cycling steps of receiving the phase adjustment instruction to storing the determination result until a number of cycles reaches a preset number of times;
- according to the determination result corresponding to the number of cycles, adjusting the phase of the DQS signal according to a preset second adjustment rule.

A device for adjusting phase of a bidirectional data strobe (DQS) signal includes:

- a first phase control circuit configured to receive a phase adjustment instruction and adjust the phase of the DQS signal according to a preset first adjustment rule;
- a first signal sampling circuit configured to receive a signal sampling instruction to sample the DQS signal, and return a sampling result of the DQS signal;
- a port physical layer circuit configured to determine whether the sampling result is correct and store a determination result;
- a second phase control circuit configured to, when functions of the first phase control circuit, the first signal sampling circuit and the port physical layer circuit are cyclically executed for a preset number of cycles, according to the determination result corresponding to the number of cycles, adjust the phase of the DQS signal according to a preset second adjustment rule.

In the method for adjusting the phase of a bidirectional data strobe DQS signal, the port physical layer circuit sends the phase adjustment instruction through the bus; the memory controller receives the phase adjustment instruction through the bus, and then the memory controller forwards the phase adjustment instruction to the first phase control circuit. After receiving the phase adjustment instruction, the first phase control circuit adjusts the phase of the bidirectional data strobe DQS signal according to the preset first rule. Then, the port physical layer circuit sends the signal sampling instruction through the bus again; the memory controller receives the signal sampling instruction through the bus, and then the memory controller forwards the signal sampling instruction to the first signal sampling circuit. After receiving the signal sampling instruction, the first signal sampling circuit samples the bidirectional data strobe DQS signal and returns the bidirectional data strobe DQS signal through the bus. The port physical layer circuit determines whether the aforementioned adjustment of phase of the bidirectional data strobe DQS signal is correct according to the returned bidirectional data strobe DQS signal, and stores the determination result. Finally, the steps from the port physical layer circuit sending the phase adjustment instruction through the bus to storing the determination result, are cycled, until the number of cycles reaches a preset number. According to the determination result saved in each cycle, the gate phase of the bidirectional data strobe DQS signal is adjusted according to the preset second adjustment rule. By utilizing the characteristic that temperature drift is a slow-changing signal and removing restriction conditions that the performance of the high-speed sampling circuit of the port physical layer circuit part must reach a multiple of the rate of the bidirectional data strobe DQS signal in the related art, the bottleneck of chip design is reduced, and the DQS temperature drift problem can be solved stably and reliably.

BRIEF DESCRIPTION OF THE DRAWINGS

In order to better illustrate the technical solutions of the embodiments of the present application, a brief introduction will be made to the accompanying drawings required in the description of the embodiments of the present application. Obviously, the accompanying drawings in the following description are only some embodiments of the present application. For those skilled in the art, other drawings can be obtained from these drawings without paying creative labor.

FIG. 3 show a table of a second adjustment rule of a method for adjusting phase of a bidirectional data strobe (DQS) signal according to an embodiment of the present application; and FIG. 4 is a schematic diagram of a device for adjusting phase of a bidirectional data strobe (DQS) signal according to an embodiment of the present application.

DETAILED DESCRIPTION OF PREFERRED EMBODIMENTS

Figure 1:
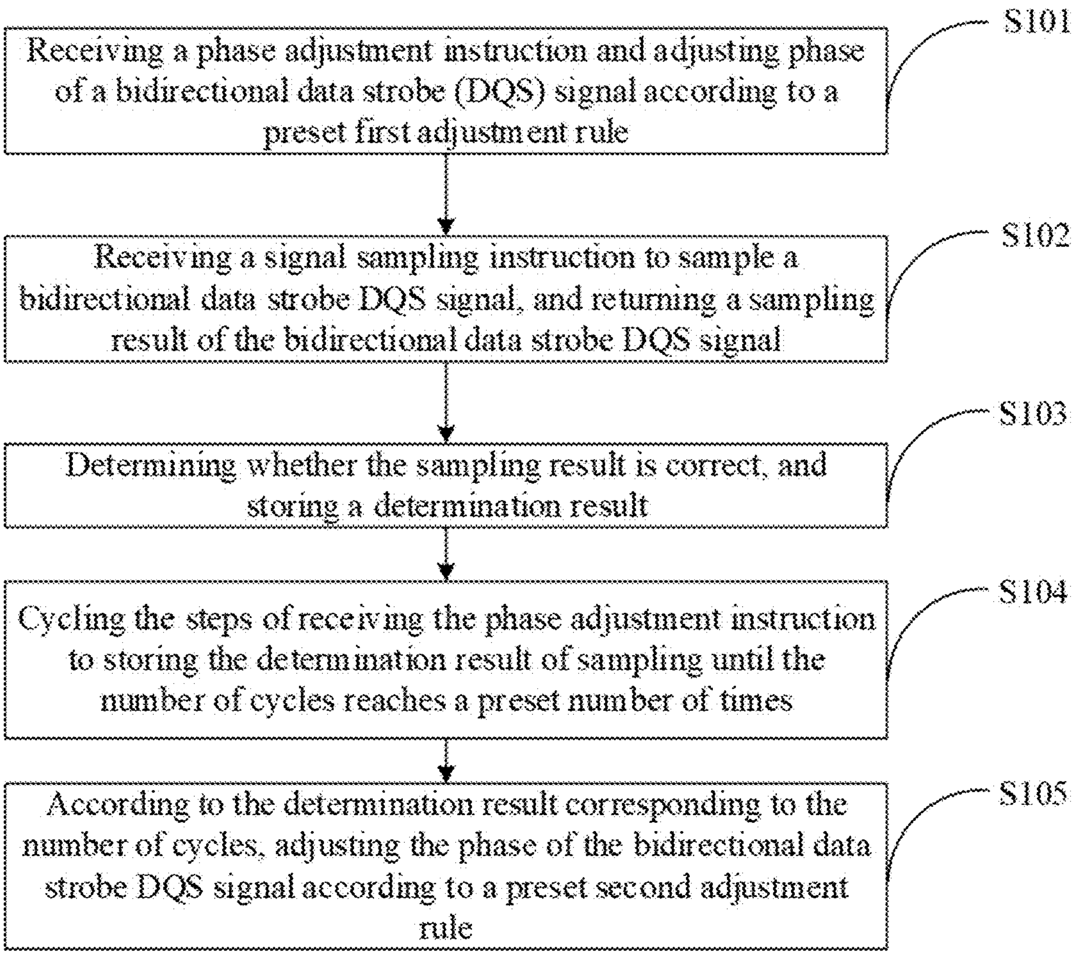
FIG. 1 is a flowchart of a method for adjusting phase of a bidirectional data strobe (DQS) signal according to an embodiment of the present application.

The technical solutions in the embodiments of the present application will be described hereinafter in a clear and complete manner in conjunction with the accompanying drawings of the embodiments of the present application. Obviously, the following embodiments are merely a part of, rather than all of, the embodiments of the present application, and based on these embodiments, a person skilled in the art may obtain the other embodiments, which also fall within the scope of the present application.

In order to facilitate understanding of the present application, the technical terms involved in the present application are explained as follows.

1. Field programmable gate array (FPGA) is a semi-customized circuit in special application integrated circuits, and generally consists of three parts: logic block, programmable interconnect channel, and I/O block.
2. Double data rate synchronous dynamic random access memory (double data rate SDRAM, DDR) is a type of memory.
3. Bidirectional data strobe (DQS) is a bidirectional data strobe sampling signal and is used to accurately distinguish each data transmission cycle within one clock cycle.
4. Port physical layer (PHY), I.e., port physical layer circuit, is an analog-digital hybrid circuit, which is responsible for receiving electrical and optical analog signals, and after demodulation and analog-to-digital conversion, transmitting, through a media independent interface (MII), the signals to an MAC chip for processing.
5. Temperature drift means that parameters of transistor will change when the temperature changes, which will lead to change in parameters of a semiconductor device, resulting in that dynamic parameters of a circuit are unstable, or even that the circuit is unable to work properly. In this embodiment, the temperature drift refers to frequency change of the bidirectional data strobe (DQS) signal caused by temperature changes.

In order to solve the problem of temperature drift of the bidirectional data strobe (DQS) signal in the DDR of the FPGA, the present application provides a solution. By utilizing the characteristic that the temperature drift is a slowly changing signal, the port physical layer circuit sends a gate phase adjustment instruction. After receiving the gate phase adjustment instruction, a first phase control circuit adjusts phase of the bidirectional data strobe DQS signal according to a preset first adjustment rule. Then, a first signal sampling circuit receives a signal sampling instruction, samples the bidirectional data strobe DQS signal DQS, and returns the DQS signal to the port physical layer circuit. The port physical layer circuit determines whether a sampling result of the bidirectional data strobe DQS signal is correct, and cycles the phase adjustment process of the bidirectional data strobe DQS signal for a preset number of times according to the first adjustment rule. Finally, according to results of phase adjustment of the bidirectional data strobe DQS signal in the preset number of cycles, the phase of the bidirectional data strobe DQS signal is adjusted according to a preset second rule.

In one embodiment, as shown in FIG. 1, a method for adjusting phase of a bidirectional data strobe (DQS) signal is provided and includes the following steps S101 to S105.

S101: receiving, by a first phase control circuit, a phase adjustment instruction and adjusting phase of a bidirectional data strobe (DQS) signal according to a preset first adjustment rule.

Further, a memory controller is used to forward the phase adjustment instruction. The method specifically includes: receiving, by a memory controller, the phase adjustment instruction, and forwarding the phase adjustment instruction to the first phase control circuit.

Further, a timer is added to the port physical layer circuit, and the timer is used to control a transmission frequency of the phase adjustment instruction. The method specifically includes: when a single preset time period of the timer ends, transmitting, by the port physical layer circuit, the phase adjustment instruction. The timer can preset the time period, and may also reset the time period according to actual change of the temperature drift phenomenon of the bidirectional data strobe DQS signal. That is, if the temperature drift phenomenon of the bidirectional data strobe DQS signal occurs frequently, the time period of the timer is reduced; and if the temperature drift phenomenon of the bidirectional data strobe DQS signal occurs rarely, the time period of the timer is increased.

Further, a bus is used to transmit the phase adjustment instruction. The method specifically includes: transmitting, by the port physical layer circuit, the phase adjustment instruction to the memory controller through the bus.

Figure 2:
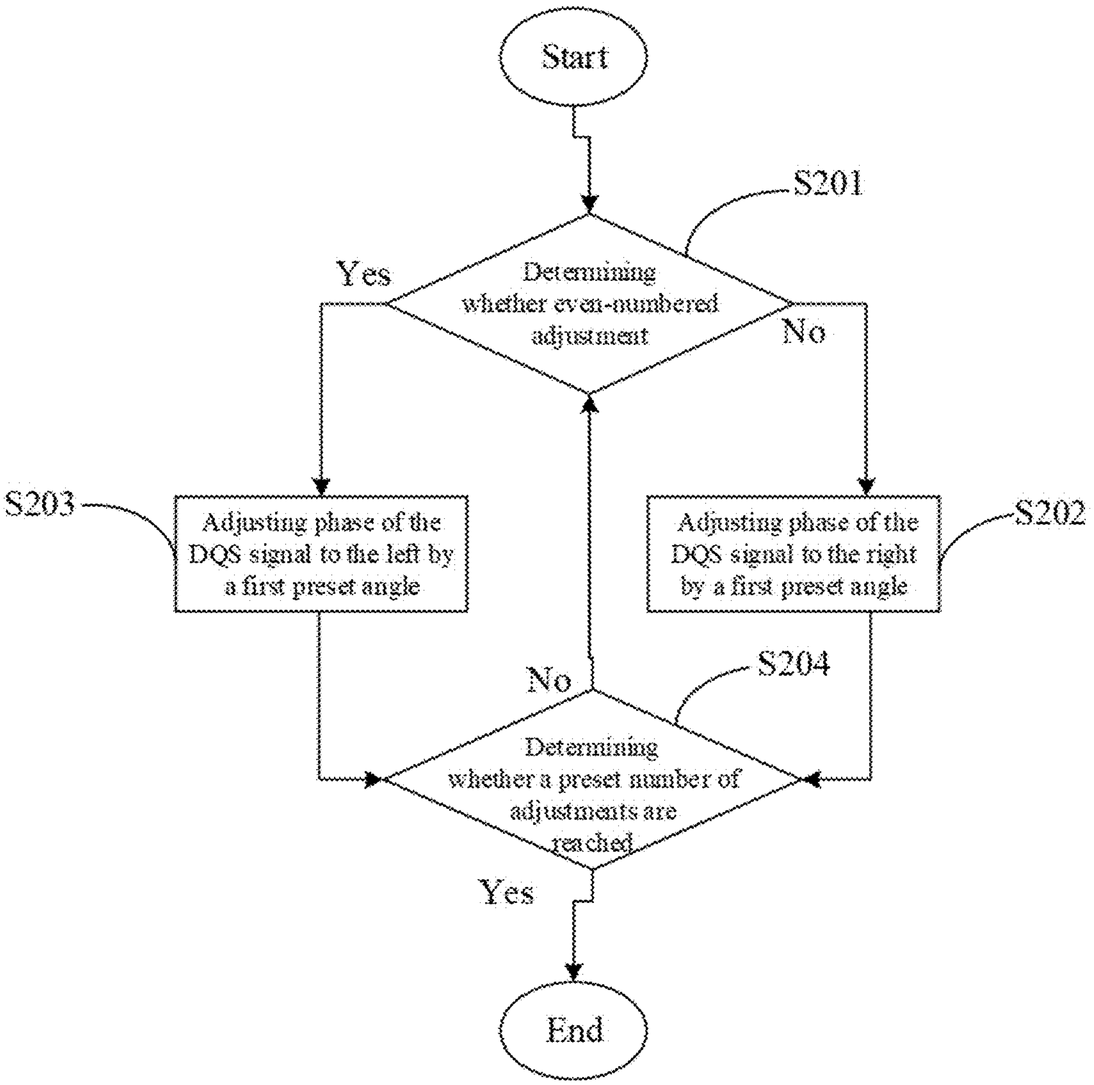
FIG. 2 is a flowchart of a first adjustment rule of a method for adjusting phase of a bidirectional data strobe (DQS) signal according to an embodiment of the present application.
Figure 5:
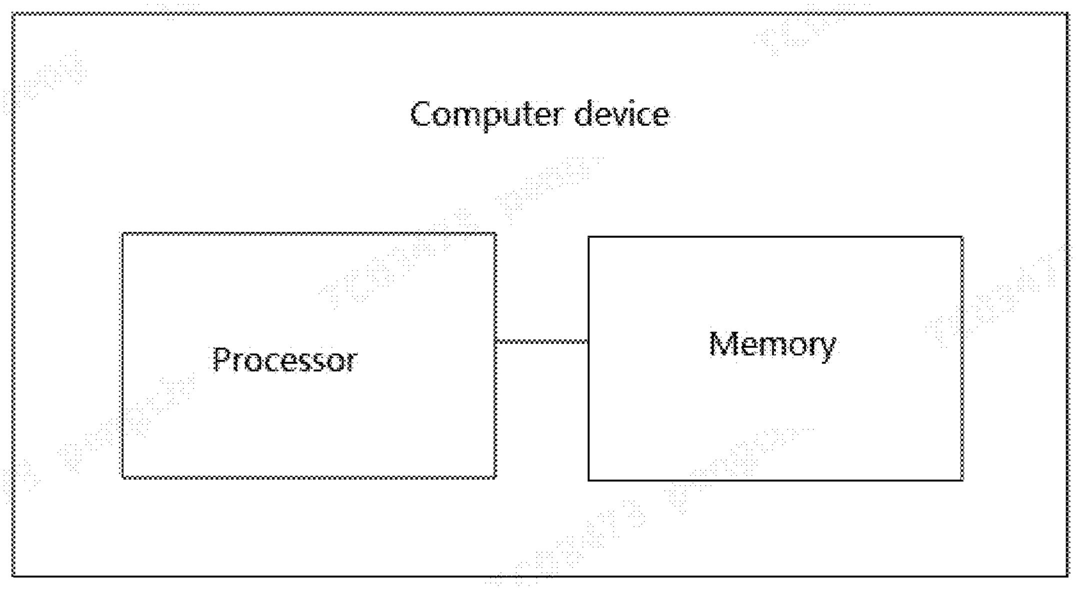
FIG. 5 is a schematic diagram to show the memory and the processor according to an embodiment of the present application.
Figure 6:
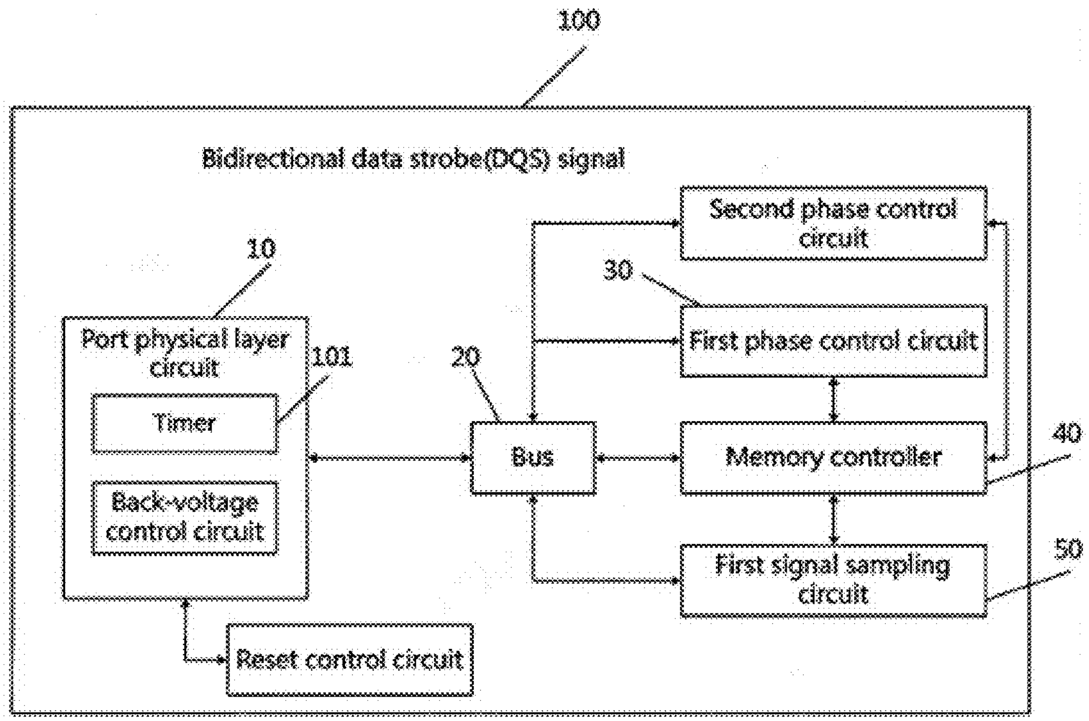
FIG. 6 is a schematic diagram to show the second phase control circuit according to an embodiment of the present application.

As shown in FIG. 2, the preset first adjustment rule includes the following steps S201 to S204.

S201: determining whether it is an even-numbered adjustment; if not, executing the step S202; if yes, executing the step S203.

S202: adjusting, a phase of the bidirectional data strobe DQS signal to the left by a first preset angle, and then executing the step S204.

S203: adjusting, a phase of the bidirectional data strobe DQS signal to the right by a first preset angle, and then executing the step S204.

S204: determining whether a preset number of adjustments are reached; if not, continuing to execute the step S201; if yes, ending the adjustment process.

It is to be noted that in the temperature drift phenomenon, what changes in the bidirectional data strobe DQS signal is the phase of the signal, and frequency and amplitude of the signal do not change. Therefore, the measure for the temperature drift of the bidirectional data strobe DQS signal is to adjust the phase of the bidirectional data strobe DQS signal. The determining whether it is an even-numbered adjustment in the step S201 is only a method for distinguishing the number of times, and it may also be changed to a similar method based on whether it is an odd-numbered adjustment to effectively distinguish adjacent times. More methods for distinguishing the number of times are not repeated here. The adjusting a phase of the bidirectional data strobe DQS signal to the left in the step S202 and adjusting a phase of the bidirectional data strobe DQS signal to the right in the step S203 are merely exemplary, that is, it is only necessary that a direction of the phase change of the bidirectional data strobe DQS signal in the step S202 is opposite to a direction of the phase change of the bidirectional data strobe DQS signal in the step S203.

S102: receiving a signal sampling instruction to sample a bidirectional data strobe DQS signal, and returning a sampling result of the bidirectional data strobe DQS signal.

Further, the signal sampling instruction is forwarded by using a memory controller. The method specifically includes: receiving, by the memory controller, the signal sampling instruction, and forwarding the signal sampling instruction to the first signal sampling circuit. After receiving the signal sampling instruction, the first signal sampling circuit starts sampling the bidirectional data strobe DQS signal. The signal sampling instruction further includes a time length parameter for signal sampling, that is, the first signal sampling circuit samples the bidirectional data strobe DQS signal of a corresponding duration according to the time length parameter included in the signal sampling instruction. Optionally, the time length parameter may also be set to a default time length value. When the time length parameter is not included in the signal sampling instruction, the first signal sampling circuit samples the bidirectional data strobe DQS signal of a corresponding duration according to the default time length value.

Further, the signal sampling instruction is transmitted by using a bus. The method specifically includes: sending, by the port physical layer circuit, the signal sampling instruction to the memory controller through the bus.

Further, the bidirectional data strobe DQS signal is transmitted by using a bus. The method specifically includes: after the first signal sampling circuit samples the bidirectional data strobe DQS signal, returning the bidirectional data strobe DQS signal through the bus.

It is to be particularly noted that when the bus is used to transmit the bidirectional data strobe DQS signal, the phase adjustment instruction and the signal sampling instruction, the bus is managed by using back pressure control, which specifically includes: determining whether the bus is being used to transmit the bidirectional data strobe DQS signal, or the phase adjustment instruction or the signal sampling instruction; if yes, suspending, in the bus, processing of instructions and data from a user end, and resuming processing of instructions and data from the user end after transmission process of the bidirectional data strobe DQS signal, or the phase adjustment instruction or the signal sampling instruction is completed.

S103: determining whether the sampling result is correct, and storing a determination result.

Specifically, the port physical layer circuit sends the signal sampling instruction through the bus; after the memory controller receives the signal sampling instruction through the bus, the memory controller forwards the signal sampling instruction to the first signal sampling circuit. After the first signal sampling circuit receives the signal sampling instruction, the first signal sampling circuit samples the bidirectional data strobe DQS signal according to a preset time length parameter or a time length parameter included in the signal sampling instruction. The first signal sampling circuit returns sampled signal data of the bidirectional data strobe DQS signal through the bus. The signal data of the bidirectional data strobe DQS signal not only includes waveform curve information of the bidirectional data strobe DQS signal, but also includes a signal correctness flag bit. The signal correctness flag bit indicates whether the sampled signal data of the bidirectional data strobe DQS signal is true or false. In this embodiment, the signal correctness flag bit is an integer value of 1 or 0. When the signal correctness flag bit is 1, it indicates that the sampled signal data of the bidirectional data strobe DQS signal is true and valid. When the signal correctness flag bit is 0, it indicates that the sampled signal data of the bidirectional data strobe DQS signal is false and invalid. The port physical layer circuit determines whether the DQS signal data is true and valid or false and invalid according to the value of the signal correctness flag bit. It is to be noted that the port physical layer circuit determines whether the signal data of bidirectional data strobe DQS signal is true and valid or false and invalid only according to the signal correctness flag bit, without using the waveform information of the bidirectional data strobe DQS signal. The waveform information of the bidirectional data strobe DQS signal sampled by the first signal sampling circuit is discarded and deleted; and only the result of determining whether sampling of the bidirectional data strobe DQS signal is true and valid or false and invalid according to the signal correctness flag bit, is stored. By discarding and deleting the waveform information of the bidirectional data strobe DQS signal and storing only the result of determining whether sampling of the bidirectional data strobe DQS signal is true and valid or false and invalid, it greatly reduces overhead of storage resources and improves efficiency of solving temperature drift problems.

S104: cycling the steps of receiving the phase adjustment instruction to storing the determination result of sampling until the number of cycles reaches a preset number of times.

In this embodiment, the temperature drift problem is solved by using the first phase control circuit to adjust the phase of the bidirectional data strobe DQS signal, and the accuracy of adjusting the phase of the bidirectional data strobe DQS signal needs to be determined based on the phase adjustment results of the bidirectional data strobe DQS signal for a preset number of times. Only when the number of times is sufficient, the accuracy of final adjustment of the phase of the bidirectional data strobe DQS signal can be fully guaranteed.

Further, a state machine is used to manage the sampling process of the bidirectional data strobe DQS signal. The method specifically includes:

after the port physical layer circuit sends the phase adjustment instruction through the bus, receiving, by the memory controller, the phase adjustment instruction, and monitoring, by the memory controller, whether the bus is in idle time; if the bus is in idle time, sending, by the memory controller, an ACK response through the bus; and the state machine switching from an idle state to an active state;

after the port physical layer circuit sends the signal sampling instruction through the bus, the state machine switching from the active state to a data reading state, and the port physical layer circuit waiting for the first signal sampling circuit to return a sampled bidirectional data strobe DQS signal;

after the port physical layer circuit receives the bidirectional data strobe DQS signal through the bus, the state machine switching from the data reading state to a verification state, and the port physical layer circuit starting to verify whether the received bidirectional data strobe DQS signal is true, and storing a result of verifying whether the bidirectional data strobe DSQ signal is true;

after the first phase control circuit adjusts the phase of the bidirectional data strobe DQS signal according to the preset second adjustment rule, the state machine switching from the verification state to a reset state, and resetting a circuit associated with the bidirectional data strobe DQS signal in the port physical layer circuit;

after resetting the circuit associated with the bidirectional data strobe DQS signal in the port physical layer circuit, the state machine switching from the reset state to the idle state, and the port physical layer circuit waiting to send the phase adjustment instruction through the bus after a new timing cycle of the timer ends.

S105: according to the determination result corresponding to the number of cycles, adjusting the phase of the bidirectional data strobe DQS signal according to a preset second adjustment rule.

Specifically, the port physical layer circuit stores the determination results of a preset number of cycles, and the determination result is a result of whether it is correct or not to attempting to adjust the phase of the bidirectional data strobe DQS signal according to the preset first adjustment rule. A final direction of the phase of the bidirectional data strobe DQS signal to the left or right can be determined according to the correct number of times the phase of the bidirectional data strobe DQS signal is adjusted to the left or right within the preset number of cycles, and the phase of the bidirectional data strobe DQS signal can be adjusted by a preset second angle.

As shown in FIG. 3, FIG. 3 shows a second adjustment rule table. The phase of the bidirectional data strobe DQS signal is adjusted according to the preset second rule. The first column of the table in FIG. 3 represents a determination result of a preset number of cycles, and the second column of the table represents corresponding operation of the phase adjustment of the bidirectional data strobe DQS signal. When the determination result of the preset number of cycles is that the number of errors in adjusting to the left is less than a set number and the number of errors in adjusting to the right is greater than a set number, the phase of the bidirectional data strobe DQS signal is adjusted to the left by a second preset angle. After the phase of the bidirectional data strobe DQS signal is adjusted to the left by the second preset angle, the circuit associated with the bidirectional data strobe DQS signal in the port physical layer circuit is reset once. when the determination result of the preset number of cycles is that the number of errors in adjusting to the left is greater than a set number and the number of errors in adjusting to the right is less than a set number, the phase of the bidirectional data strobe DQS signal is adjusted to the right by a second preset angle. After the phase of the bidirectional data strobe DQS signal is adjusted to the right by the second preset angle, the circuit associated with the bidirectional data strobe DQS signal in the port physical layer circuit is reset once. When the determination result of the preset number of cycles is another result other than the above two results, the phase of the bidirectional data strobe DQS signal is not adjusted, and there is no need to reset the circuit associated with the DQS signal in the port physical layer circuit.

In the method for adjusting the phase of a bidirectional data strobe DQS signal in one embodiment, the port physical layer circuit sends the phase adjustment instruction through the bus; the memory controller receives the phase adjustment instruction through the bus, and then the memory controller forwards the phase adjustment instruction to the first phase control circuit. After receiving the phase adjustment instruction, the first phase control circuit adjusts the phase of the bidirectional data strobe DQS signal according to the preset first rule. Then, the port physical layer circuit sends the signal sampling instruction through the bus again; the memory controller receives the signal sampling instruction through the bus, and then the memory controller forwards the signal sampling instruction to the first signal sampling circuit. After receiving the signal sampling instruction, the first signal sampling circuit samples the bidirectional data strobe DQS signal and returns the bidirectional data strobe DQS signal through the bus. The port physical layer circuit determines whether the aforementioned adjustment of phase of the bidirectional data strobe DQS signal is correct according to the returned bidirectional data strobe DQS signal, and stores the determination result. Finally, the steps from the port physical layer circuit sending the phase adjustment instruction through the bus to storing the determination result, are cycled, until the number of cycles reaches a preset number. According to the determination result saved in each cycle, the gate phase of the bidirectional data strobe DQS signal is adjusted according to the preset second adjustment rule. By utilizing the characteristic that temperature drift is a slow-changing signal and removing restriction conditions that the performance of the high-speed sampling circuit of the port physical layer circuit part must reach a multiple of the rate of the bidirectional data strobe DQS signal in the related art, the bottleneck of chip design is reduced. Meanwhile, the state machine is used to generate various working states to effectively and orderly control the process of solving the temperature drift of the bidirectional data strobe DQS signal, and reliability and stability of the method for adjusting phase of a bidirectional data strobe (DQS) signal can be ensured.

It is to be understood that the sequence number of each step in the above embodiment does not mean the order of execution. The execution order of various procedures should be determined by their functions and internal logic, and should not constitute any limitation on the implementation process of the embodiment of the present application.

In one embodiment, a device for adjusting phase of a bidirectional data strobe (DQS) signal 100 is provided. As shown in FIG. 4, the device 100 includes a port physical layer circuit 10, a bus 20, a first phase control circuit 30, a memory controller 40, and a first signal sampling circuit 50. These components are described in detail hereinafter.

The port physical layer circuit 10 is used to determine whether a sampling result is correct and store a determination result.

The bus 20 is used to transmit a bidirectional data strobe DQS signal, a phase adjustment instruction and a signal sampling instruction. Specifically, the port physical layer circuit sends the phase adjustment instruction to the memory controller through the bus; the port physical layer circuit sends the signal sampling instruction to the memory controller through the bus; after the first signal sampling circuit samples the bidirectional data strobe DQS signal, the first signal sampling circuit returns the bidirectional data strobe DQS signal through the bus.

The first phase control circuit 30 is used to receive the phase adjustment instruction and adjust the phase of the bidirectional data strobe DQS signal according to a preset first adjustment rule.

The memory controller 40 is used to forward the phase adjustment instruction to the first phase control circuit and forward the signal sampling instruction to the first signal sampling circuit. Specifically, the memory controller receives the phase adjustment instruction and forwards the phase adjustment instruction to the first phase control circuit; the memory controller receives the signal sampling instruction and forwards the signal sampling instruction to the first signal sampling circuit.

The first signal sampling circuit 50 is used to receive the signal sampling instruction to sample the bidirectional data strobe DQS signal, and return a sampling result of the bidirectional data strobe DQS signal.

Further, when the functions of the first phase control circuit, the first signal sampling circuit and the port physical layer circuit are cyclically executed for a preset number of cycles, the second phase control circuit is used to, according to the determination result corresponding to the number of cycles, adjust the phase of the bidirectional data strobe DQS signal in accordance with a preset second adjustment rule.

Further, as shown in FIG. 4, the port physical layer circuit 10 further includes:

- a timer 101 used to, when a single preset time period of the timer ends, enable the port physical layer circuit, to transmit the phase adjustment instruction.

Further, the device 100 further includes:

- a back-voltage control circuit used to determine whether the bus is being used to transmit the bidirectional data strobe DQS signal, the phase adjustment instruction or the signal sampling instruction; if yes, enabling the bus to suspend processing of instructions and data from a user end, and resume processing of instructions and data from the user end after transmission process of the bidirectional data strobe DQS signal, or the phase adjustment instruction or the signal sampling instruction is completed;
- a reset control circuit used to reset a circuit associated with the DQS signal in the port physical layer circuit, after adjusting the phase of the bidirectional data strobe DQS signal according to the preset first adjustment rule and adjusting the phase of the bidirectional data strobe DQS signal according to the preset second adjustment rule.

The meaning of "first" and "second" in the above modules/units is only to distinguish different modules/units, and is not used to define which module/unit has a higher priority or other limiting meanings. In addition, the terms "including" and "having" and any of their variations are intended to cover non-exclusive inclusions. For example, a process, method, system, product or device that includes a series of steps or modules is not necessarily limited to those steps or modules clearly listed, but may include other steps or modules that are not clearly listed or inherent to the process, method, product or device. The division of modules in the present application is only a logical division, and there may be other division methods when implemented in actual applications.

The specific definition of the device for adjusting phase of a bidirectional data strobe (DQS) signal can refer to the definition of the method for adjusting phase of a bidirectional data strobe (DQS) signal, which will not be repeated here. All or part of various modules in the above device for adjusting phase of a bidirectional data strobe (DQS) signal can be implemented by software, hardware and a combination thereof. The above modules can be embedded in or independent of a processor in a computer device in the form of hardware, or can be stored in a memory of the computer device in the form of software, so that the processor can call and execute operations corresponding to the above modules.

In one embodiment, a computer-readable storage medium is provided, and includes a computer program stored thereon. The computer-readable storage medium may be non-volatile or volatile. The computer program, when executed by a processor, cause the processor to perform the steps of the method for adjusting the phase of the bidirectional data strobe DQS signal in the above embodiment, such as the steps S101 to S105 shown in FIG. 1 and other extensions of the method and extensions of related steps.

Those skilled in the art can understand that all or part of the processes in the above embodiment of methods can be completed by instructing the relevant hardware through a computer program, and the computer program can be stored in a non-volatile computer-readable storage medium. When the computer program is executed, the processes of the embodiments of the above methods are implemented. Any reference to memory, storage, database or other media used in the embodiments provided in this application may include non-volatile and/or volatile memory. The non-volatile memory may include read-only memory (ROM), programmable ROM (PROM), electrically programmable ROM (EPROM), electrically erasable programmable ROM (EEPROM) or flash memory. The volatile memory may include random access memory (RAM) or external cache memory. As an illustration and not limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronous link DRAM (SLDRAM), memory bus (Rambus) direct RAM (RDRAM), direct memory bus dynamic RAM (DRDRAM), and memory bus dynamic RAM (RDRAM).

Those skilled in the art can clearly understand that for convenience and simplicity of description, divisions of the above functional units and modules are merely used as an example. In actual applications, the above functions can be assigned to different functional units and modules as needed, that is, internal structure of the device can be divided into different functional units or modules to complete all or part of the functions described above.

The embodiments described above are only used to illustrate the technical solutions of the present application, rather than to limit the same. Although the present application has been described in detail with reference to the aforementioned embodiments, those skilled in the art should understand that the technical solutions described in the aforementioned embodiments may still be modified, or some of the technical features may be replaced by equivalents. Such modifications or replacements do not deviate the essence of the corresponding technical solutions from the spirit and scope of the technical solutions of the embodiments of the present application, and should all be included in the protection scope of the present application.

What is claimed is:

1. A method for adjusting phase of a bidirectional data strobe (DQS) signal, comprising:

- receiving a phase adjustment instruction, and adjusting phase of the DQS signal according to a preset first adjustment rule;

receiving a signal sampling instruction to sample the DQS signal, and returning a sampling result of the DQS signal;

determining whether the sampling result is correct, and storing a determination result;

cycling steps of receiving the phase adjustment instruction to storing the determination result until a number of cycles reaches a preset number of times;

according to the determination result corresponding to the number of cycles, adjusting the phase of the DQS signal according to a preset second adjustment rule;

wherein before the adjusting phase of the DQS signal according to a preset first adjustment rule, the method further includes:

managing, by a state machine, an adjustment process of adjusting the phase of the DQS signal according to the preset first adjustment rule and the second adjustment rule.

2. The method according to claim 1, wherein the phase adjustment instruction and the signal sampling instruction are obtained through a memory controller;

the memory controller is used to receive the phase adjustment instruction and the signal sampling instruction, and forward the phase adjustment instruction to a first phase control circuit, and forward the signal sampling instruction to a first signal sampling circuit.

3. The method according to claim 1, wherein the receiving a phase adjustment instruction, includes:

receiving the phase adjustment instruction according to a preset frequency.

4. The method according to claim 1, wherein the managing, by a state machine, an adjustment process of adjusting the phase of the DQS signal according to the preset first adjustment rule and the second adjustment rule, includes:

after receiving the phase adjustment instruction, the state machine switching from an idle state to an active state;

after receiving the signal sampling instruction, the state machine switching from the active state to a data reading state;

after sampling the DQS signal, the state machine switching from the data reading state to a verification state;

after adjusting the phase of the DQS signal according to the preset second adjustment rule, the state machine switching from the verification state to a reset state.

5. The method according to claim 4, wherein after adjusting the phase of the DQS signal according to the preset first adjustment rule and adjusting the phase of the DQS signal according to the preset second adjustment rule, the method further includes:

resetting a circuit associated with the DQS signal in a port physical layer circuit;

the state machine switching from the reset state to the idle state.

6. A device for adjusting phase of a bidirectional data strobe (DQS) signal, comprising:

a first phase control circuit configured to receive a phase adjustment instruction and adjust the phase of the DQS signal according to a preset first adjustment rule;

a first signal sampling circuit configured to receive a signal sampling instruction to sample the DQS signal, and return a sampling result of the DQS signal;

a port physical layer circuit configured to determine whether the sampling result is correct and store a determination result;

a second phase control circuit configured to, when functions of the first phase control circuit, the first signal sampling circuit and the port physical layer circuit are cyclically executed for a preset number of cycles, according to the determination result corresponding to the number of cycles, adjust the phase of the DQS signal according to a preset second adjustment rule.

7. The device according to claim 6, wherein the device further includes a memory controller;

the memory controller is used to receive the phase adjustment instruction and the signal sampling instruction, and forward the phase adjustment instruction to the first phase control circuit, and forward the signal sampling instruction to the first signal sampling circuit.

8. The device according to claim 6, wherein the device further includes a timer;

the timer is used to control a frequency of the phase adjustment instruction.

9. The device according to claim 7, wherein the device further includes a bus; and the port physical layer circuit and the memory controller are connected via the bus;

the bus is used to transmit the phase adjustment instruction, the signal sampling instruction, and the DQS signal.

10. A computer device, comprising: a processor, a memory coupled to the processor, and a computer program stored in the memory and executable on the processor; wherein the processor executes the computer program to perform:

receiving a phase adjustment instruction, and adjusting phase of the DQS signal according to a preset first adjustment rule;

receiving a signal sampling instruction to sample the DQS signal, and returning a sampling result of the DQS signal;

determining whether the sampling result is correct, and storing a determination result;

cycling steps of receiving the phase adjustment instruction to storing the determination result until a number of cycles reaches a preset number of times;

according to the determination result corresponding to the number of cycles, adjusting the phase of the DQS signal according to a preset second adjustment rule;

wherein before the adjusting phase of the DQS signal according to a preset first adjustment rule, the processor executes the computer program to perform:

managing, by a state machine, an adjustment process of adjusting the phase of the DQS signal according to the preset first adjustment rule and the second adjustment rule.

11. The computer device according to claim 10, wherein the phase adjustment instruction and the signal sampling instruction are obtained through a memory controller;

the memory controller is used to receive the phase adjustment instruction and the signal sampling instruction, and forward the phase adjustment instruction to a first phase control circuit, and forward the signal sampling instruction to a first signal sampling circuit.

12. The computer device according to claim 10, wherein when receiving a phase adjustment instruction, the processor executes the computer program to perform:

receiving the phase adjustment instruction according to a preset frequency.

13. The computer device according to claim 10, wherein the managing, by a state machine, an adjustment process of adjusting the phase of the DQS signal according to the preset first adjustment rule and the second adjustment rule, includes:

after receiving the phase adjustment instruction, the state machine switching from an idle state to an active state;

after receiving the signal sampling instruction, the state machine switching from the active state to a data reading state;

after sampling the DQS signal, the state machine switching from the data reading state to a verification state;

after adjusting the phase of the DQS signal according to the preset second adjustment rule, the state machine switching from the verification state to a reset state.

14. The computer device according to claim 13, wherein after adjusting the phase of the DQS signal according to the preset first adjustment rule and adjusting the phase of the DQS signal according to the preset second adjustment rule, the processor executes the computer program to perform:

resetting a circuit associated with the DQS signal in a port physical layer circuit;

the state machine switching from the reset state to the idle state.

* * * * *